United States Patent [19]

Livolsi

[11] Patent Number: 6,051,994
[45] Date of Patent: *Apr. 18, 2000

[54] VARIABLE VOLTAGE DRIVER

[75] Inventor: Robert R. Livolsi, Shokan, N.Y.

[73] Assignee: International Business Machines Corporation, Armonk, N.Y.

[*] Notice: This patent is subject to a terminal disclaimer.

[21] Appl. No.: 09/071,905

[22] Filed: May 4, 1998

[51] Int. Cl.[7] .................. H03K 19/094; H03K 19/0175; H03K 19/20
[52] U.S. Cl. .................. 326/83; 326/86; 326/68; 326/81; 326/119
[58] Field of Search .................. 326/62, 63, 68, 326/83, 86, 87, 80, 81, 112, 119, 121

[56] References Cited

U.S. PATENT DOCUMENTS

| | | |
|---|---|---|
| 4,079,301 | 3/1978 | Johnson, III . |
| 4,280,091 | 7/1981 | Hiltner . |
| 4,535,294 | 8/1985 | Ericksen et al. . |
| 5,280,204 | 1/1994 | Livolsi ........................................ 326/62 |
| 5,410,267 | 4/1995 | Haycock et al. ........................... 326/81 |
| 5,818,260 | 10/1998 | Kuo ............................................ 326/86 |

OTHER PUBLICATIONS

"Switch Mode Power Supply For CRT Display" IBM Technical Disclosure Bulletin, vol. 29, No. 9, Feb. 1987, pp. 3921–3922.
"Transistor Rectifier Regulator" IBM Technical Disclosure Bulletin, Nov. 1979, pp. 2319–2320.

Primary Examiner—Michael Tokar
Assistant Examiner—James H. Cho
Attorney, Agent, or Firm—Lynn L. Augspurger

[57] ABSTRACT

A variable voltage driver circuit produces an output swing off of a single voltage power supply which is logically configurable to allow interconnection of CMOS chips of varying technologies and power supplies. First a voltage requirement for a destination chip is identified to which a driver chip is to be coupled, and the voltage requirement for the driver chip is identified. The variable voltage driver circuit is activated to produce a variable voltage output swing off of a single voltage power supply meeting the voltage requirements of the driver chip. The driver has data input, and level selection inputs and pins which select and enable the driver independent of the output level state that the driver is in. The driver has predriver stage having a data input and a first and a second driver output level input for determining the voltage level at the output, and having control circuits for setting output states at the output stage to a supply level, intermediate voltage level, and a disabled level, and an output stage, having devices which establish a down level to set a logical state, and an up level and an intermediate level for setting a different logical state. A logical state level at the input will normally result in an output at the same logical state level but selection of driver output level inputs determines the voltage level at the output for one of the logical state levels, so that a selected one of said driver output level inputs determines the actual output voltage of the circuit.

8 Claims, 2 Drawing Sheets

VARIABLE VOLTAGE DRIVER

CROSS REFERENCE TO RELATED APPLICATIONS:

The present application related to the following patent application filed concurrently herewith:

"Method of interconnecting CMOS chip types", filed May 4, 1998, U.S. Ser. No. 09/071,906, now U.S. Pat. No. 5,900,777.

This application and the present application are owned by one and the same assignee, International Business Machines Corporation of Armonk, N.Y.

FIELD OF THE INVENTION

This invention is related to computer systems and in particular to a variable voltage driver circuit that produces a variable voltage output swing off of a single voltage power supply which is logically configurable to allow interconnection of CMOS chips of varying technologies and power supplies.

BACKGROUND OF THE INVENTION

Computer systems which use CMOS chips of varying technologies and power supplies for increased performance create unique problems which arise because of the need to develop special circuits to bridge the different technologies. Some time ago connecting CMOS circuits and TTL circuits was addressed, as those described in the article in IBM's TDB v36 n6A 06-93 p149–152, entitled "Laser Fuse Programmable Input Level Receivers" by authors M. K. Ciraula, C. M. Durham, and D. L. Jallice noted that VLSI chips require specific logic input levels that are characteristic of the system environment(s) in which they are to be used. Then two most common were CMOS (1.5V and 3.5V) and TTL (0.8V and 2.0V). They noted that when designing chips the interface circuits, known as on-chip receivers or OCRs, engineers must consider which set of logic input levels will be required in the system environment. When multiple system environments are expected with potentially differing logic input level requirements, the authors suggested designers must provide the option for different logic levels on the VLSI chip, stating that typically, these different levels are programmable using one or two processing mask level changes. However, this creates two problems: 1. multiple separate sets (or subsets) of processing masks are required, and 2. chips must be stockpiled in distinct formats. For discussion purposes, the two most common interface levels, TTL and CMOS were presented in this article. However, it should be noted that the concepts presented can be extended to most any interface level requirement. This article describes a means to provide input-level programming from CMOS to TTL or TTL to CMOS without the use of processing mask changes using laser fuses. Consequently, the resulting chip designs are more versatile for manufacturing and system designers, producing multiple input levels from a single processing mask set. Therefore, chip stockpiling can be done without regard to input-level requirements when on-chip receivers designed in CMOS technologies can be made to switch at various voltage levels by changing the ratio of input pull-up (P-FET) and pull-down (N-FET) devices. However, changing the hysteresis required added to the OCR circuitry to provide additional noise immunity, which is accomplished by adding feedback latches, Schmitt trigger circuits, hysteresis latches etc. This adds delay and complexity and cost to development.

Intel Corporation's inventors M. B. Haycock and S. R. Mooney, in U.S. Pat. No. 5,410,267 issued Apr. 25, 1995 Described a 3.3 V to 5 V interface buffer which had to be built for a specific purpose as a solid state BiCMOS device implemented on a reduced voltage process designed to operate from 3.3 V and 5 V supplies and capable of receiving a 0–3.3 V input signal while providing a external swing signal from 0–5 V. Specifically, cross coupled PMOS and NMOS devices manufactured by a 3.3 V process are utilized with level shifting diodes for achieving a device which operates on higher voltages than conventional circuit design techniques allow for a given process technique, while providing a 0–5 V output at the sending device. The references cited in this patent are replete with special interconnection circuits for particular applications.

IBM patented a "Precision Hysteresis Circuit" by B. L. Stakely and R. Wenda, with U.S. Pat. No. 5,122,680, for a CMOS circuit arrangement with precise balanced switch points. The circuit arrangement included a voltage-follower which forces a reference voltage across an on-chip reference resistor. The current which is generated is mirrored and is made to flow through a plurality of on-chip resistors. The mirrored current flowing through the plurality of resistors generates a plurality of proportional reference voltages. Two of the proportional reference voltages are used to set the switching threshold to one input of a comparator whose output is fed back to control a switch which selects one of the two voltages. Another one of the proportional reference voltages is coupled to another input of the comparator. The circuit arrangement forms a hysteresis circuit if positive and negative thresholds are chosen. Generating hysteresis on an integrated circuit chip generated a a precise voltage across an on-chip resistance, and current mirroring provided a current (IREF) flowing in the on-chip resistance (R0) to flow in a plurality of ratioed independent resistive means. Then a fixed voltage is generated across a selected one of the ratioed independent resistive means and compared with a selected one of a plurality of switched voltages generated across selected ones of the ratioed independent resistance. However, these ideas did not address a growing and current problem which needs to be addressed as complex machines are developed which migrate some components among successive machines as when new machines use newer technologies (migrating from one CMOS process which could be and has been called a Level 5, to a more dense, higher level, such as a level 6 process or technology) with lower signal swings. As an example in a situation addressed by the preferred embodiment of my invention in newer S/390 machines the off multichip module (MCM) memory paths are 2.5V signals, while it needs to couple to a cache of one technology which operates at 2.5V for one machine while a related machine developed with a different technology may need a 1.8V signal. The development of a separate 1.8V memory interface for the related machine is costly. There is a need to improve the circuits in multiple technology chip crossings to ease migratable machines allowing older technology circuits to be used in a new generation of machines without having to remake the circuits for a new technology and having to incur the consequent development costs, which could be in the million dollar range

SUMMARY OF THE INVENTION

I have provided a variable voltage driver circuit that is located off chip that produces a variable voltage output swing off of a single voltage power supply. The driver circuit is logically configurable.

The circuit improve a standard driver by providing a current path that redirects current back to a pre-driver stage.

The preferred embodiment illustrates an off chip driver circuit produces a variable voltage output swing of 2.5V and 1.8V off of a single 2.5V power supply. Signal integrity is maintained through the ratio of device sizes in the feedback path and pre-driver. These circuits therefore conform to standard I/O cell definitions and power grid topologies used in the art, and they also meet the same ESD protection schemes of standard drivers.

Not only can the circuit ease migratation between machines it allows various technology circuits to be used in a new generation of machines not contemplated by the original designs.

These and other improvements are set forth in the following detailed description. For a better understanding of the invention with advantages and features, refer to the description and to the drawings.

(Note: For convenience of illustration, FIGURES may be separated in parts and as a convention we place the top of the FIGURE as the first sheet, with subsequent sheets proceeding down and across when viewing the FIGURE, in the event that multiple sheets are used.)

DETAILED DESCRIPTION OF THE INVENTION

Before considering our preferred embodiments in detail, it may be worthwhile to note, by way of example, that the preferred embodiment allows use of circuits which were designed for two different machines and allows accommodation for two machines (A2 and M2) in which the processor to L2 (2nd level cache) and memory paths present a unique set of problems. On both machines the processor is a 1.8V technology. The L2 is a 2.5V technology on A2 and a 1.8V technology on M2. For both machines, the memory, which is an off module path, is a 2.5V technology.

In the development of my invention, I tried to develop a technology bridge without degrading performance while maintaining migratability to still other machines. If an extra 2.5V supply be added to the 1.8V processor chip, this would address the design but require multiple voltage supplies on the chip. These designs, sacrifice performance and in some cases, cannot be physically designed by doing so. And I think this is a poor solution that would cause performance to be degraded with I/O circuits that require two supplies. 1.8V supply could be added to an L2 chip but that requires something that cannot now be physically designed given the level of technology used in this area so such an L2 chip becomes impossible to manufacture.

As migration of components amongst successive machines becomes a problem when new machines use newer technologies with lower signal swings and yet the development of new memory interfaces is costly. The off module (MCM) memory paths are 2.5V signals. Where the L2 is 2.5V for A2, and 1.8V for M2. The development of a separate 1.8V memory interface for M2 is costly.

Figure 1:
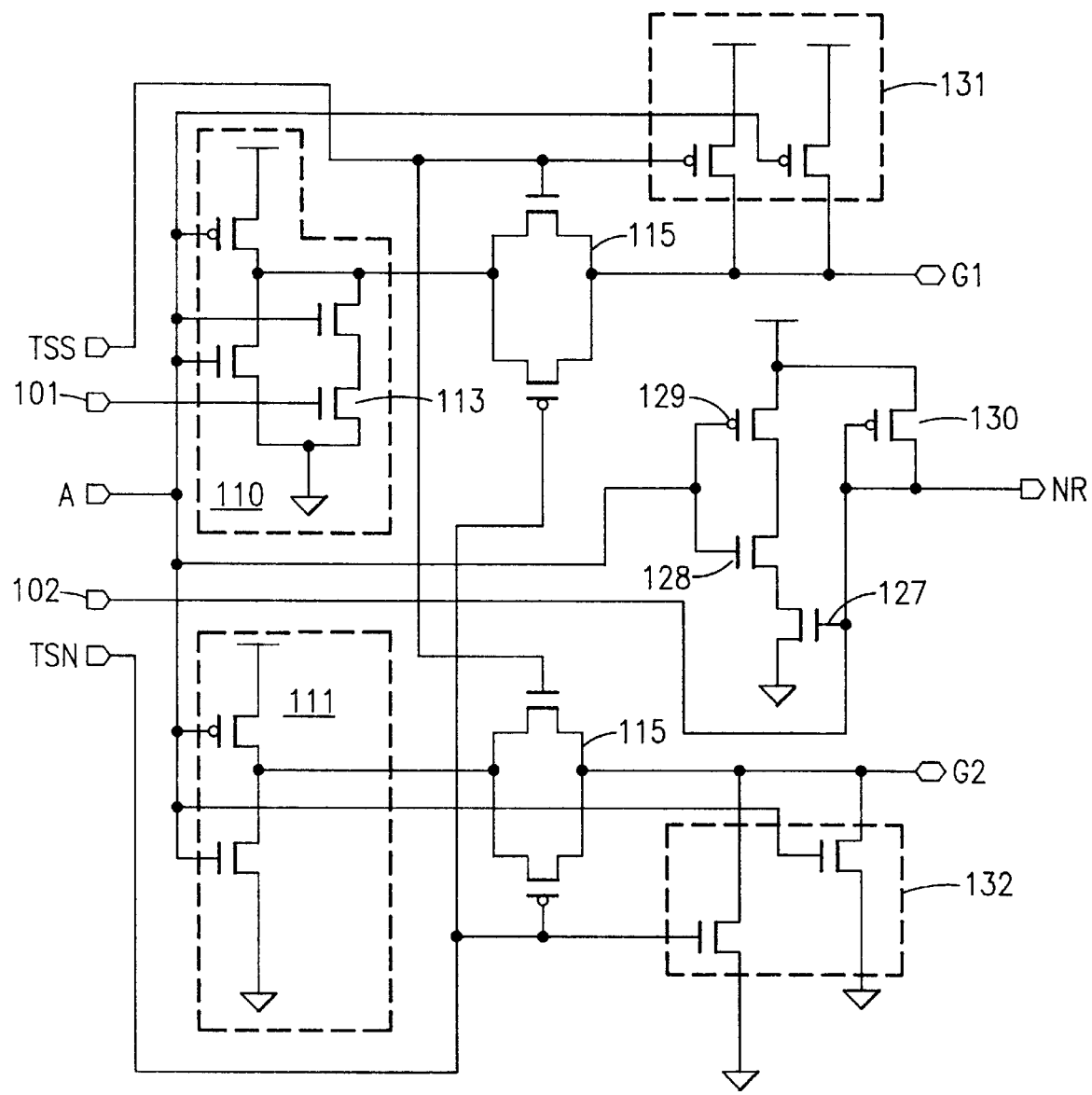
FIG. 1 shows the preferred embodiment of a variable voltage driver.

In my preferred embodiment illustrated in FIG. 1 I have designed an off chip driver that produces a variable voltage output swing. i.e., 2.5V and 1.8V off of a single 2.5V power supply. The circuit will generate either a 2.5V signal swing or can produce a 1.8V signal swing. There is no loss in performance between the two signal swings. The 1.8V signal is obtained by a feedback path around the output PFET device. These circuits are also switchable. That is they are logically configured. They can be selected to put out either signal swing through a single input pin. This permits migratability across machines with technologies that use lower signal swings.

The basic circuit is that of a standard driver. A major difference lies in my design is in a path that redirects current back to the pre-driver stage. Signal integrity is maintained through the ratio of device sizes in the feedback path and pre-driver. These circuits therefore conform to the standard I/O cell definitions and power grid topologies. They also meet the same ESD protection schemes of standard drivers. These circuits are also bidirectional and can receive dual voltage swings as well. Here again performance integrity is maintained. Receiver thresholds are switched as well through the same logical pin thus maintaining signal integrity.

An advantage of the single power supply which is provided for multiple technologies in my preferred embodiment is that besides achieving the necessary signal swing for each voltage need, it is logically configurable. These designs do not sacrifice performance. They are as fast as standard drivers.

Turning now to our invention in greater detail, it will be seen from FIG. 1 which illustrates the preferred embodiment of my predriver circuit. There the data input is pin A, and pins 101 and 102 select the level that the driver will put out, and TSS and TSN select and enable the driver independent of the output level state that the driver is in. The output pin G1 controls the output PFET and the pin G2 controls the output NFET. NE is a pin controlling the feedback path for level selection. The inverter 110 is responsible for selecting the level based on input 101. If 101 is a high level it is in the normal mode where the output device 124 is pulled up to the supply level it drives NFET 113 which sets the level of G1 which drives the gate of the device 124. If 101 is in a low level it is in the intermediate mode and drives the gate of NFET 113 OFF which sets the level of G1 which sets the output device 124 to an intermediate level through PFET 126 being on. PFET 126 is on when the data path A is set to a high level and 102 is high (101 would be low). When 101 is low, G1 is at a different level which drives device 124 to an intermediate output. Pass gates 115 and 115' turn the driver off when disabled when TSS is low and TSN is high respectively. In both the normal mode and intermediate mode TSS is high and TSN is low.

Figure 2:
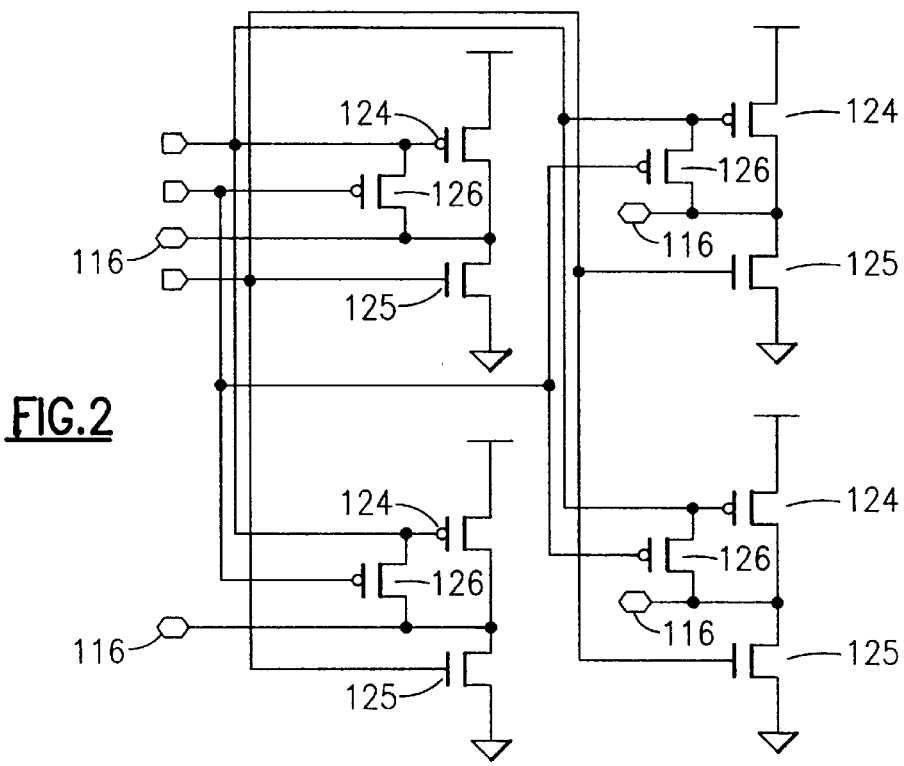
FIG. 2 shows the feedback path.

The data path high drives gate NFET 128 turning it on and bringing node NE low. When gate 128 is on, this turns gate 126 on. This provides a feedback path between node 116 (note this node is illustrated at several common points) as shown in FIG. 2 to G1 of FIGS. 1 and 2. PFETS 129 and 130 bring node NE high which turns 126 off by the action of A pin being low and 102 being low. The A input and TSS control the set of PFETs 131 to bring G1 high to turn off 124, while the A input and TSN control the set of NFETs to bring G2 low to turn off NFET 125.

Inverter 111 drives node G2 through pass gates 115' and G2 drives NFET 125 and brings the Output low.

Figure 3:
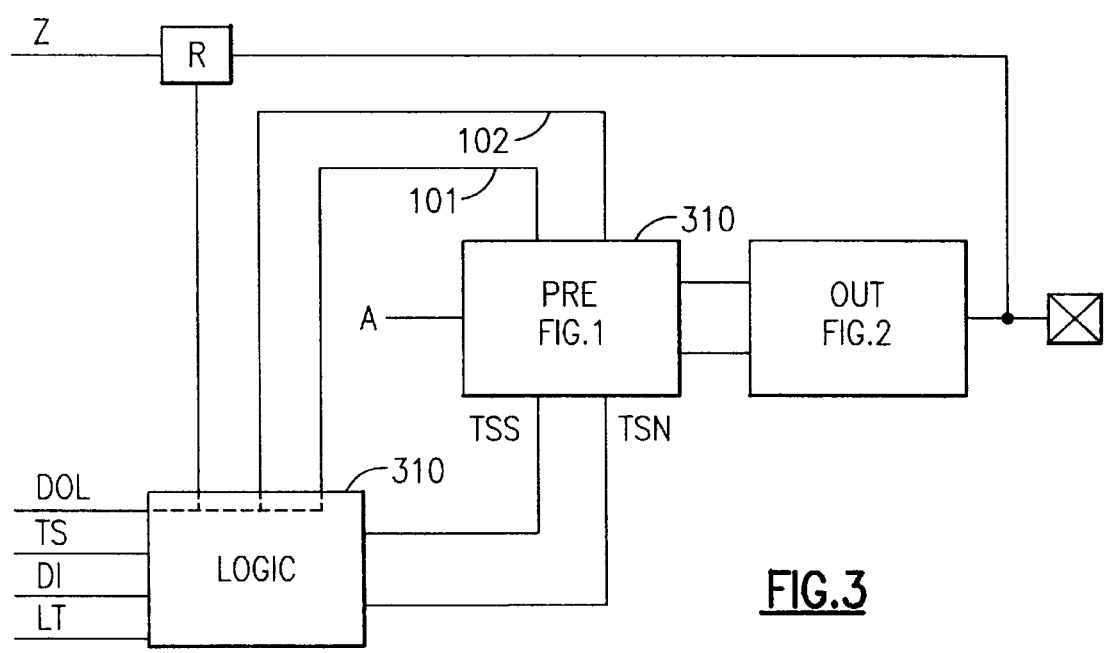
FIG. 3 illustrates the selection of the logical state of the driver output level.

FIG. 3 illustrates the selection of the logical state of the driver output level. There schematically (the specific circuit is within the level of ordinary skill) a driver output level state is selected for the predriver stage (FIG. 1) of the circuit. There is a logic block 310 having inputs of a desired driver output level (DOL), a tri-stage enable TS, a driver inhibit (DI) and a logical terminal (LT). DOL logic outputs the level selection for 101 and 102 while TS and Dl and LT determine the TSS and TSN levels. The (FIG. 1) prestage circuit sets the output stage (FIG. 2). The receiver R represents the first chip circuit which has a facility to vary the thresholds based on what the second chip's circuit needs are.

While we have described our preferred embodiments of our invention, it will be understood that those skilled in the art, both now and in the future, may make make various improvements and enhancements which fall within the scope of the claims which follow. These claims should be construed to maintain the proper protection for the invention first disclosed.

What is claimed is:

1. An off chip variable voltage driver circuit for driving chips which have differing voltage requirements which are mounted on a supporting substrate comprising, a predriver stage and an output stage, said predriver stage having a data input and a first and a second driver output level input for determining the voltage level at the output, and having control circuits for setting output states at an output of the output stage to a supply level, intermediate voltage level, and a disabled level, and the output stage has devices which establish a down level to set a logical state, and and an up level and an intermediate level for setting a different logical state, an input to the predriver stages being a logical state level signal and the output of the output stage being a logical state level signal, whereby a logical state level at the input will normally result in an output at the same logical state level but selection of driver output level inputs determines the voltage level at the output for one of the logical state levels, so that a selected one of said driver output level inputs determines the actual output voltage of the circuit.

2. The circuit according to claim 1 wherein said off chip variable voltage driver circuit is deposited on a first chip and the output voltage off said first chip at an interface to a second chip to which said first chip is to be connected is determined by logical selection of the pins of the first driver output level input.

3. The circuit according to claim 1 wherein signal integrity is maintained through the ration of device sizes in a feedback path and pre-driver conforming to standard I/O cell definitions and power grid topologies.

4. The circuit according to claim 1 wherein the driver circuits are bidirectional and can receive dual voltage swings with receiver thresholds switched through the same logical pin.

5. The circuit according to claim 1 wherein the circuit is switchable and generates either a 2.5V signal swing or a 1.8V signal swing without performance loss between the two signal swings, and the 1.8V signal is obtained by a feedback path around the output PFET device.

6. The circuit according to claim 1 wherein the circuit is switchable one of multiple signal swings can be selected be selected to put out a selected signal swing through a single input pin enabling migratability across machines with technologies that use differing signal swings.

7. The circuit according to claim 1 wherein said off chip driver that produces a variable voltage output swing of differing voltages off of a single 2.5V power supply.

8. The circuit according to claim 1 wherein said voltage driver circuit produces a variable voltage output swing off of a single voltage power supply which is logically configurable.

* * * * *